US012588300B2

(12) United States Patent
Gäbler et al.

(10) Patent No.: US 12,588,300 B2
(45) Date of Patent: Mar. 24, 2026

(54) SEMICONDUCTOR LIGHT SENSOR

(71) Applicant: X-FAB Global Services GmbH, Erfurt (DE)

(72) Inventors: Daniel Gäbler, Apolda (DE);
Alexander Zimmer,
Uhlstädt-Kirchhasel (DE); Robin Weirauch, Waltershausen (DE)

(73) Assignee: X-FAB Global Services GmbH, Erfurt (DE)

( * ) Notice: Subject to any disclaimer, the term of this patent is extended or adjusted under 35 U.S.C. 154(b) by 777 days.

(21) Appl. No.: 17/740,513

(22) Filed: May 10, 2022

(65) Prior Publication Data

US 2022/0359780 A1     Nov. 10, 2022

(30) Foreign Application Priority Data

May 10, 2021     (GB) ...................................... 2106645

(51) Int. Cl.
| | |
|---|---|
| *H10F 30/225* | (2025.01) |
| *H10F 71/00* | (2025.01) |
| *H10F 77/14* | (2025.01) |

(52) U.S. Cl.
CPC ......... *H10F 30/225* (2025.01); *H10F 71/121* (2025.01); *H10F 77/14* (2025.01)

(58) Field of Classification Search
CPC ...... H10F 30/225; H10F 71/121; H10F 77/14; H10F 77/959; H10F 10/14; H10F 39/103; H10F 39/12; H01L 31/107; H01L 31/068; H01L 31/02027; H01L 31/035272; H01L 31/1804; H01L 27/146; H01L 27/1443
See application file for complete search history.

(56) References Cited

U.S. PATENT DOCUMENTS

| | | | | |
|---|---|---|---|---|
| 2013/0009265 A1* | 1/2013 | Dautet | .................. | H10F 30/225 |
| | | | | 257/E31.124 |
| 2013/0099091 A1* | 4/2013 | Nemirovsky | ......... | H10F 30/225 |
| | | | | 250/206 |

(Continued)

FOREIGN PATENT DOCUMENTS

| | | |
|---|---|---|
| CN | 106601826 A | 4/2017 |
| CN | 109638092 | 4/2019 |

(Continued)

OTHER PUBLICATIONS

GB Combined Search and Examination Report for corresponding GB Application No. 2219069.8, dated Mar. 7, 2023, 4 pages.

(Continued)

*Primary Examiner* — Earl N Taylor
(74) *Attorney, Agent, or Firm* — Dority & Manning, P.A.

(57)     ABSTRACT

A light sensitive semiconductor structure comprises:
a substrate;
a doped upper region of said substrate having a first type of doping;
a first implant region located below and being in direct contact with said doped upper region, said first implant region having a second type of doping so that a pn-junction is located between said doped upper region and said first implant region; and
a second implant region located below said first implant region and having said second type of doping, and wherein a peak in a doping profile of said second type of doping is located in said second implant region.

14 Claims, 10 Drawing Sheets

(56) References Cited

U.S. PATENT DOCUMENTS

| | | | |
|---|---|---|---|
| 2016/0218236 A1* | 7/2016 | Dhulla | H10F 39/103 |
| 2017/0092801 A1* | 3/2017 | Moussy | H10F 77/206 |
| 2018/0090536 A1* | 3/2018 | Mandai | H10F 39/807 |
| 2018/0158849 A1* | 6/2018 | Henkel | H10F 30/288 |
| 2019/0363125 A1* | 11/2019 | Zimmer | H10F 39/024 |
| 2020/0028019 A1* | 1/2020 | Takimoto | H10F 77/959 |
| 2020/0411710 A1* | 12/2020 | Gäbler | H10F 30/2255 |
| 2021/0255231 A1* | 8/2021 | Zimmer | H10F 39/18 |
| 2021/0375968 A1* | 12/2021 | Gäbler | H10F 39/014 |
| 2021/0399149 A1* | 12/2021 | Gäbler | H10F 39/8057 |
| 2022/0149105 A1* | 5/2022 | Gäbler | H10F 77/331 |
| 2022/0149222 A1* | 5/2022 | Gäbler | H10F 30/225 |
| 2022/0359780 A1* | 11/2022 | Gäbler | H10F 71/121 |

FOREIGN PATENT DOCUMENTS

| | | |
|---|---|---|
| CN | 115117205 A | 9/2022 |
| CN | 115117252 A | 9/2022 |
| WO | WO2016161882 | 10/2016 |

OTHER PUBLICATIONS

GB Further Search Report for corresponding Application No. GB2106645.1, dated Jul. 1, 2022, 6 pages.

GB Combined Search and Examination Report for corresponding Application No. GB2106645.1, dated Oct. 15, 2021, 8 pages.

German Office Action (w/ English translation) for corresponding Application No. 10-2022 111 621.2, dated Jul. 17, 2024, 27 pages.

López-Martínez et al., "Limitation of SPADs quantum efficiency due to the dopants concentration gradient", 27th IEEE International Conference on Electronics, Circuits and Systems, Glasgow, Nov. 2020, pp. 1-4.

* cited by examiner

PRIOR ART

SEMICONDUCTOR LIGHT SENSOR

TECHNICAL FIELD

The present invention relates to semiconductor light sensors such as avalanche photodiodes (APDs) and single photon avalanche diodes (SPADs) and methods of manufacturing such.

BACKGROUND

A single photon avalanche diode (SPAD) comprises a pn-junction across which a high reverse bias is applied to cause an avalanche event to occur when a photo-generated charge carrier enters the multiplication region around the pn-junction.

A problem with existing SPADs is that the photo detection probability for either shorter wavelengths or longer wavelengths is reduced and highly dependent on the excess bias voltage.

A well designed photodiode has a stable response for a wide range of reverse bias voltages, and SPADs today need a well-chosen and tightly controlled excess bias voltage to show a similar level of continuity in their response behaviour.

SUMMARY OF INVENTION

Aspects of the present invention provide a light sensitive semiconductor structures and methods for forming such structures as set out in the appended claims.

Preferred embodiments of the invention will now be described with reference to the accompanying drawings.

DETAILED DESCRIPTION

Figure 1:
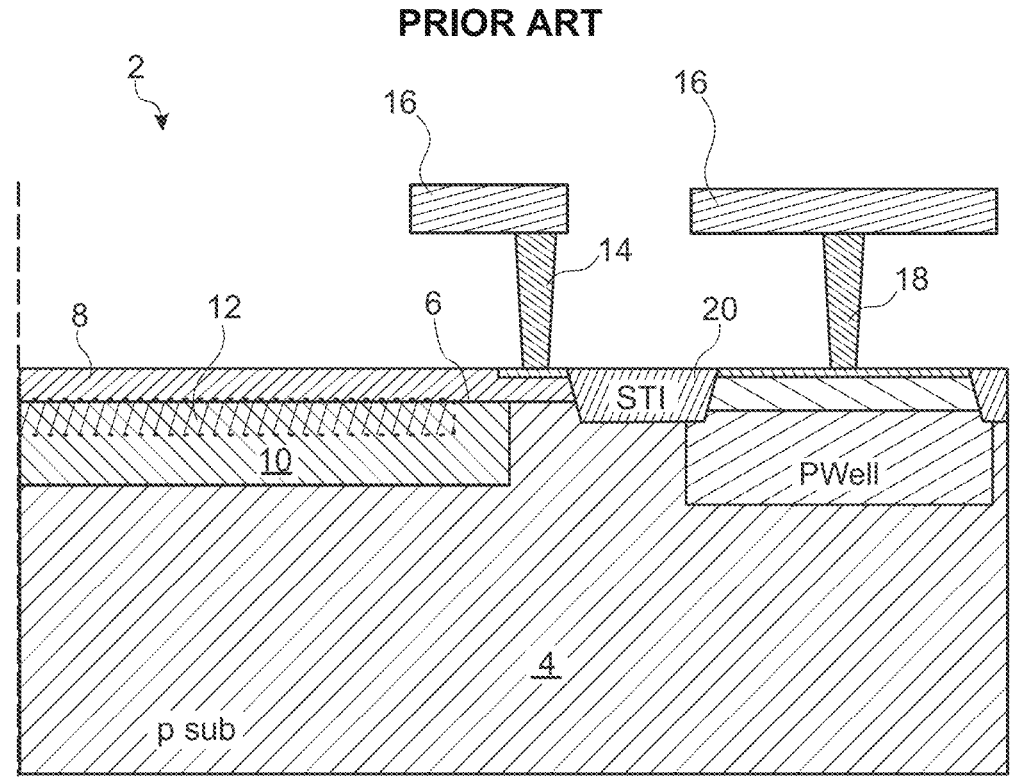
FIG. 1 shows a schematic diagram of a previous design of a light sensitive semiconductor structure including a single p-doped implant region.

FIG. 1 shows a schematic cross section of a light sensor 2, which is included for illustrative purposes. The light sensor 2 comprises a p-doped substrate 4 with a pn-junction 6 between an n-doped region 8 and a p-doped region 10. The multiplication region 12 is located around the pn-junction 6, where charge is built up to a measurable output current. The n-doped region 8 forms part of a cathode connected via contact 14 to a part of the metal layer 16. The p-doped region 10 and substrate 4 form a part of the anode, connected via contact 18 to a part of the metal layer 16. Shallow trench isolation (STI) 20 separates the anode and cathode at the surface. A bias voltage is applied across the anode and cathode (via contacts 14 and 18), such that when a light generated charge carrier enters the multiplication region 12 it is accelerated and releases further charge carriers that form a current which flows between the anode and cathode. The current flows along the path of least resistance and tends to concentrate just underneath the STI 20.

The light sensor 2 is a SPAD. In use, a large reverse bias voltage is applied across the device, such that a single light generated charge carrier can cause an avalanche and thereby be detected. The SPAD is said to be operated in Geiger mode. To stop the avalanche current and reset the device for detecting another event, the bias voltage has to be reduced, which is done by so called "quenching". Quenching can be passive, by allowing the current to be dissipated by a resistor (not shown), or active by changing the bias voltage in response to detecting the event (i.e. detecting the avalanche current).

Figure 2:
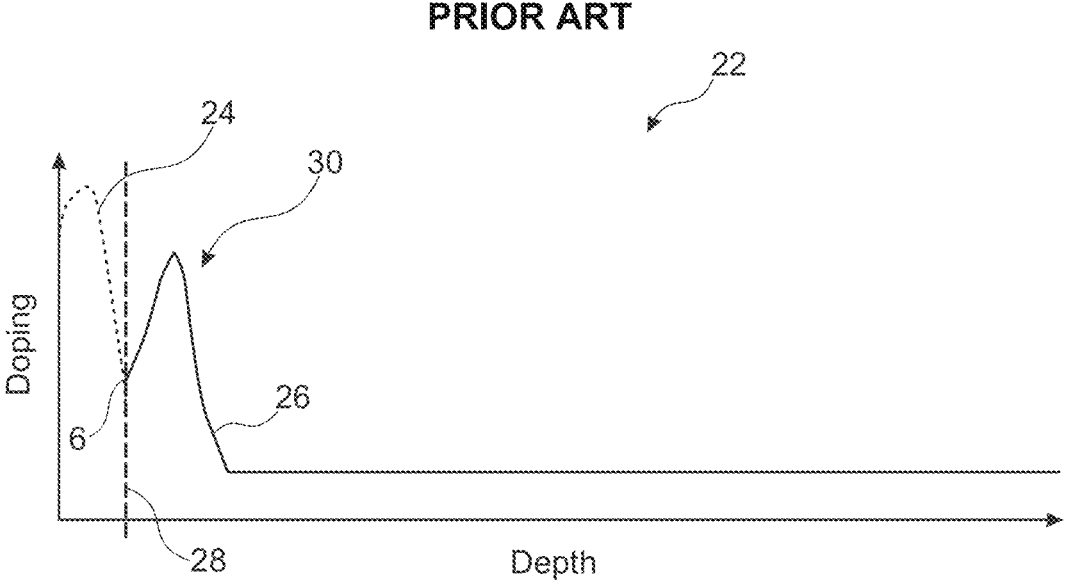
FIG. 2 shows a graph of the doping profile of the light sensitive semiconductor structure of FIG. 1.

FIG. 2 shows the doping profile 22 as a function of depth of the light sensor 2. The doping profile 22 is taken along the dashed line in FIG. 1. The profile 22 comprises a high concentration of n-doping 24 close to the surface (in n-doped region 8) and a high concentration of p-doping 26 below (in p-doped region 10), followed by a low, substantially constant concentration of p-doping 26 (in the substrate 4). The doping profile 22 changes from n-doping 24 to p-doping 26 at a depth 28, which is the depth of the pn-junction 6. There is a so called "doping-hump" 30 in the doping profile 22, corresponding to the peak doping concentration of p-doped region 10 close to the pn-junction 6. The doping hump 30 creates an intrinsic electrostatic potential, and the bias voltage needs to be sufficient to push charge carriers over the hump 30 towards the junction 6 in order to detect light absorbed below the peak concentration.

A problem with existing light sensors, such as APDs and SPADs, is the doping hump close to the multiplication region of the sensor. Since longer wavelengths tend to penetrate deeper into the semiconductor structure of the light sensor, and conversely shorter wavelengths tend to be absorbed closer to the surface, the position of the doping hump affects the detection probability of different wavelengths. The bias voltage has to be very precisely controlled to provide the correct sensor behaviour.

To at least partially overcome this problem, at least some of the embodiments described herein provide a semiconductor light sensor without a doping hump close to the multiplication region.

Figures 3, 4:
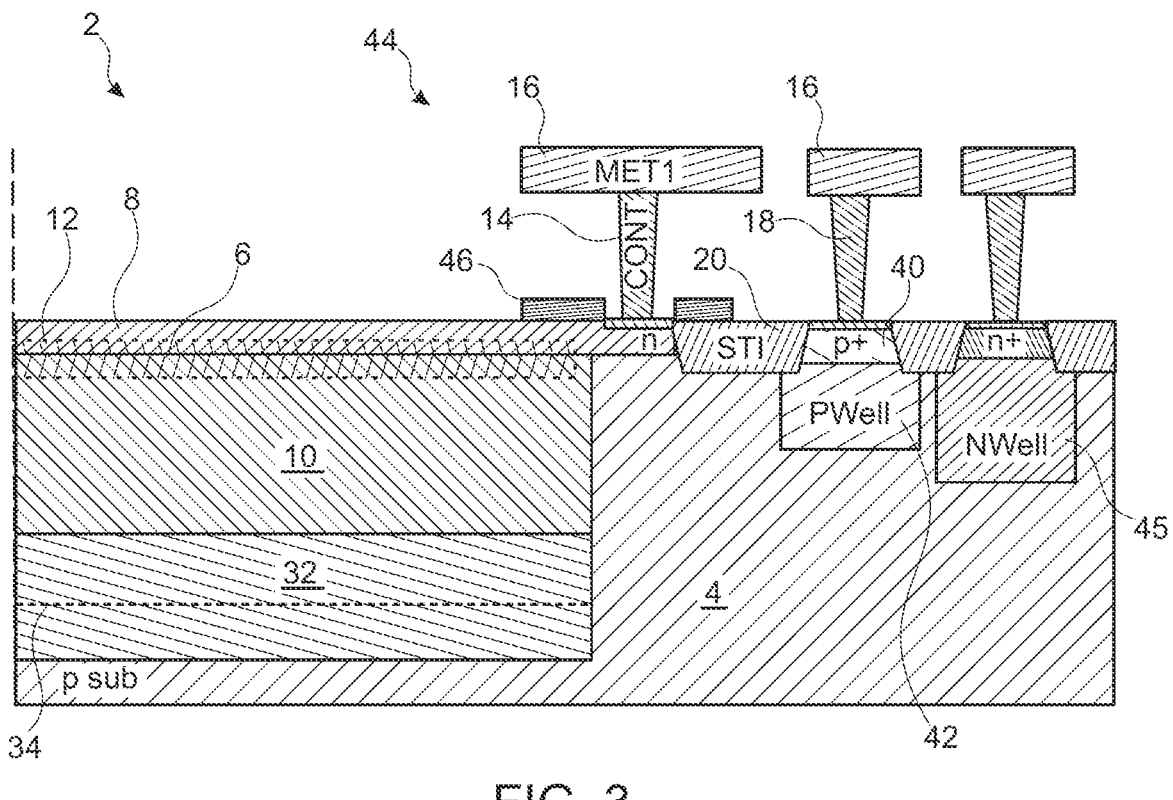
FIG. 3 shows a schematic diagram of a light sensitive semiconductor structure according to an embodiment comprising two p-doped implant regions.
FIG. 4 shows a graph of the doping profile of the light sensitive semiconductor structure of FIG. 3.

FIG. 3 shows a schematic diagram of a cross section of a light sensor 2, such as a SPAD, according to an embodiment. Similar or equivalent features in different figures have been given the same reference numerals to aid understanding and the reference numerals are not intended to limit the illustrated embodiments. The sensor 2 comprises a silicon substrate 4 with a pn-junction 6 between an n-doped region 8 and a p-doped region 10. The multiplication region 12 is located around the pn-junction 6. A second p-doped region 32 is provided underneath the first p-doped region 10. The first and second p-doped regions 10 and 32 may also be referred to as implant regions, as they are formed by two (or more) implantations.

By having two p-doped regions 10 and 32 (two or more implantations), instead of just one (as e.g. in FIG. 1), the doping hump 30 can be moved away from the first p-doped region 10, as the peak concentration is pushed deeper into the light sensor 2. The dashed line 34 running through the second p-doped region 32 indicates the position of a peak in doping concentration.

The light sensor 2 comprises an optional plasma shielding structure 44 for protecting the pn-junction 6 from plasma damage during manufacturing. The shielding structure 44 comprises polysilicon 46, and a part of the first metal layer 16, which overlap the edge of the pn-junction 6. By reducing plasma damage at or close to the pn-junction 6, the dark count rate (DCR) can be reduced. Also, the shallow trench isolation (STI) 20 is arranged such that the edge of the pn-junction 6 is buried underneath a part of the STI 30, which can provide further protection against plasma damage.

FIG. 4 illustrates the doping profile 22 of the light sensor 2 in FIG. 3. Close to the surface, there is a high concentration of n-doping 24 which drops sharply towards the depth of the pn-junction 6. The doping at the pn-junction 6, can be adjusted to provide a target breakdown voltage. The p-typed doping 26 provides two regions 48 and 50 divided by the intrinsic electric field. In the first region 48, between the pn-junction 6 and the peak 52 in the doping profile 22, the doping concentration decreases substantially linearly towards the pn-junction 6. Importantly, there is no doping hump in this region 48, and all charge carriers in this region 48 will be pushed towards the multiplication region 12 around the pn-junction 6.

In two specific embodiments of the light sensor 2, the peak 52 in the doping profile 22 is located at a depth of 3 μm and 4 μm respectively. A greater depth can provide a beneficial increase of the area (or volume in 3D) in which generated charge carriers can be detected. The maximum achievable depth depends on the manufacturing process and the equipment used. With current manufacturing techniques it is difficult to achieve a depth greater than 5 μm. The implantation depth can be controlled by the implantation energy.

The n-doped region 8 is part of a cathode connected by a metal contact 14 to the first metal layer 16 (Metal 1) in the backend stack of the sensor 2. The first p-doped region 10 and the second p-doped region 32 are part of the anode connected by metal contact 18 to the first metal layer 16.

When in use, the bias voltage is applied between the cathode and the anode via contacts 14 and 18.

Another realisation of the inventors is that a device can be improved by reducing the resistance along the current path from anode to cathode in the substrate of the device. For example, in a SPAD, such as the SPAD of FIG. 1, the current flows through the p-doped substrate 4 underneath the STI region 20. However, the substrate 4 has a relatively high resistance, which limits the current that flows during an avalanche (i.e. at an event). A greater avalanche current can provide improved photo detection.

To at least partially solve this problem, a low resistance contact region may be provided. For example, another implant region can be provided underneath a contact to decrease the resistance in that region through which the avalanche current flows when there is an event.

Figure 5:
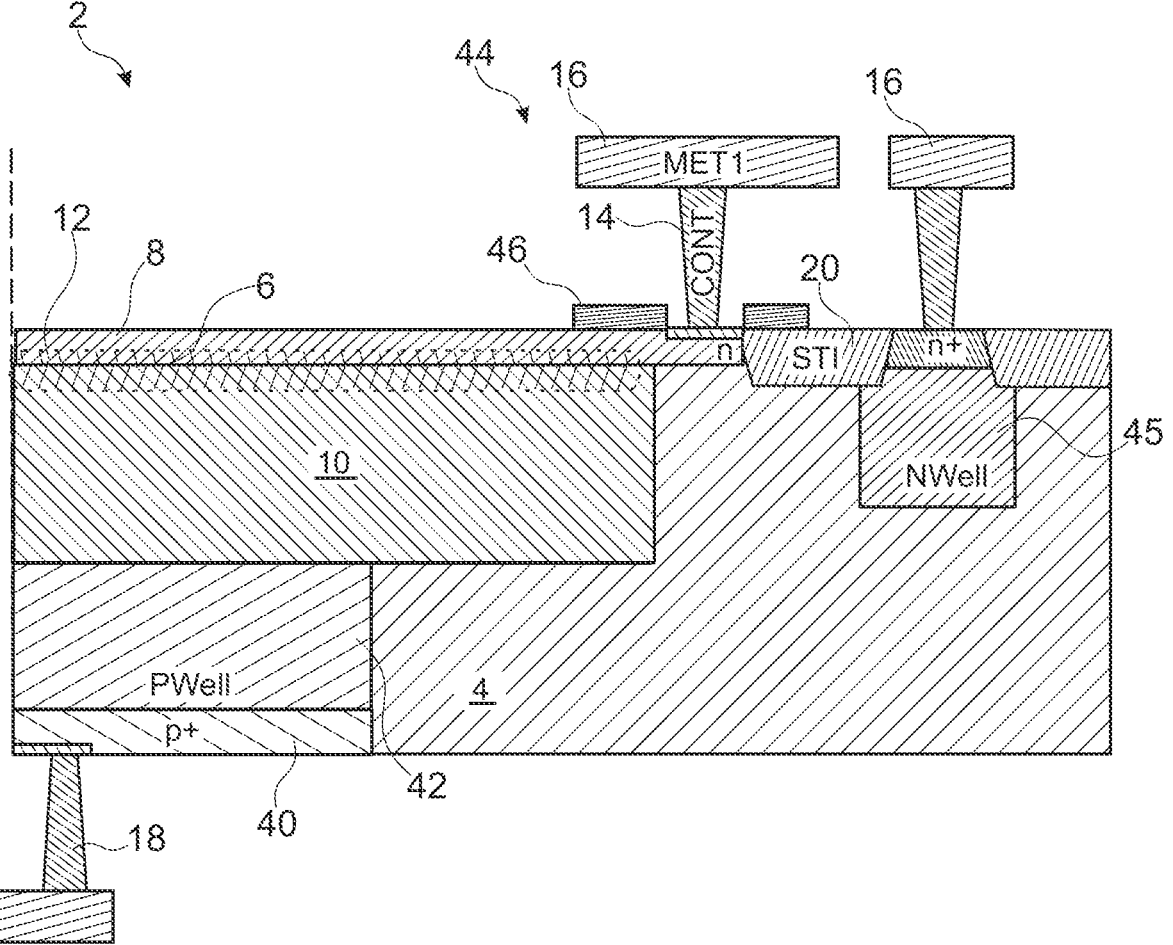
FIG. 5 shows a schematic diagram of a light sensitive semiconductor structure having a low resistance contact region.

FIG. 5 shows a schematic diagram of a cross section of a light sensor 2 according to an embodiment. Similar to the device illustrated in FIG. 3, the sensor 2 comprises a silicon substrate 4 with a pn-junction 6 between an n-doped region 8 and a p-doped region 10. The multiplication region 12 is located around the pn-junction 6. The n-doped region 8 is part of a cathode connected by a metal contact 14 to the first metal layer 16 (Metal 1) in the backend stack of the sensor 2. The p-doped region 10 is part of the anode connected by backside metal contact 18. When in use, the bias voltage is applied between the cathode and the anode via contacts 14 and 18. The anode contact 18 is connected to a low resistance region (a region having greater doping than the surrounding substrate 4) in direct contact with the p-doped implant region 10. This provides a low resistance path (without interrupting low doped substrate 4) between the anode and cathode.

To further decrease the resistance between the metal contact 18 and the silicon, a heavily doped p+ region 40 is formed underneath the contact 18 and a p-well 42 is formed between the heavily p-doped region 40 and the p-doped (implant) region 10. In use, current will follow the path of least resistance from the anode contact 18, through the heavily p-doped region 40, the p-well 42, and the p-doped region 10 and to the cathode.

Due to the decreased resistivity of the p-doped regions 40, 42 and 10, compared to the surrounding substrate 4, a greater avalanche current can be achieved for a given bias voltage compared to conventional devices where the current path goes through the substrate 4. A greater avalanche current in turn allows for quicker quenching as the device discharges following an event, which can increase the dynamic range (max intensity) of the light sensor 2.

Figure 6:
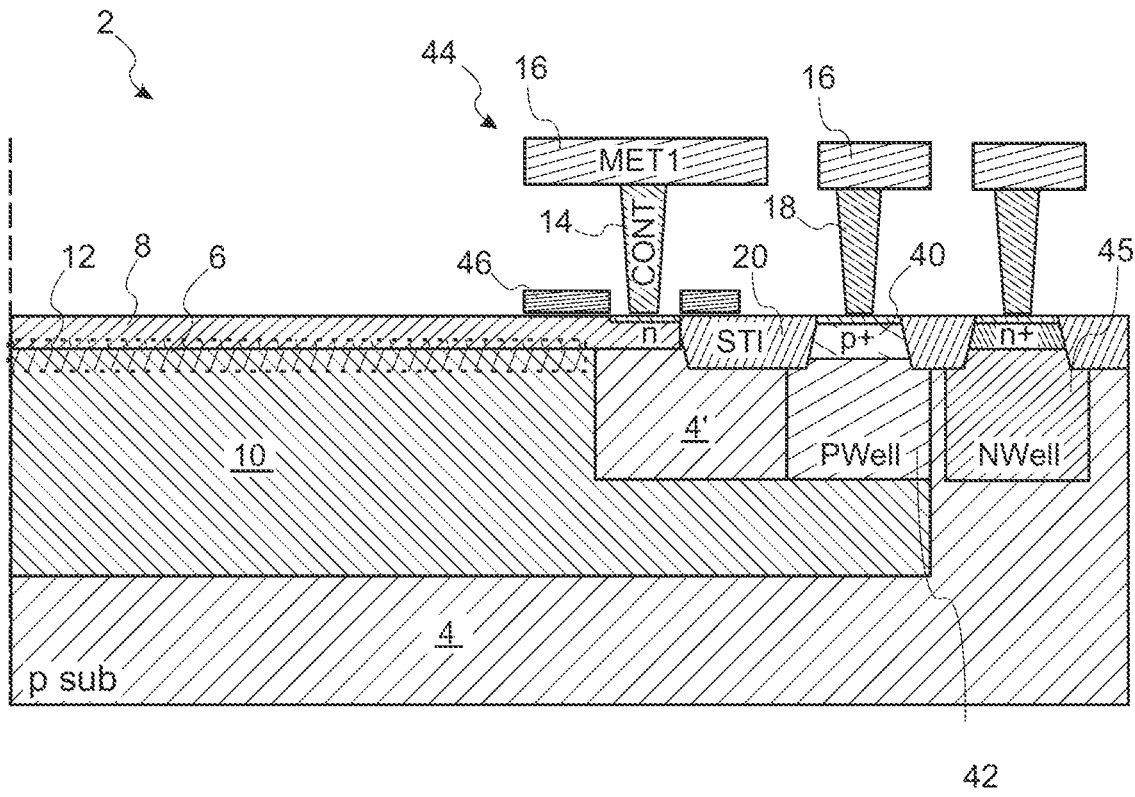
FIG. 6 shows a schematic diagram of a light sensitive semiconductor structure having an enclosed region.

FIG. 6 shows a schematic diagram of a cross section of a light sensor 2 according to another embodiment. The sensor 2 comprises a silicon substrate 4 with a pn-junction 6 between an n-doped region 8 and a p-doped region 10. The multiplication region 12 is located around the pn-junction 6. The n-doped region 8 is part of a cathode connected by a metal contact 14 to the first metal layer 16 (Metal 1) in the backend stack of the sensor 2. The p-doped region 10 is part of the anode connected by metal contact 18 to the first metal layer 16. When in use, the bias voltage is applied between the cathode and the anode via contacts 14 and 18.

Importantly, the device comprises an enclosed region 4' of the substrate 4. The enclosed region 4' is located underneath the STI region 20 and is enclosed by a p-doped region 12 and the p-well 42 of the anode contact structure. The enclosed region 4' forms a ring in three dimensions around the p-doped region 10, and can prevent the current from taking the shortest path directly underneath the STI 20 between the cathode and anode. Instead, due to the lower resistivity of the p-doped region 10 (compared to the resistivity of the substrate 4), the current flows around the enclosed region 4'. Hence, the structure provides a low resistance path around the region 4' for the current flowing from anode to cathode directly underneath the STI 20. This can also cause the current to flow more homogenously to the multiplication region 12 (rather than concentrating at the edge close to the pn-junction 6) and between contacts 14 and 18. The enclosed region 4' preferably extends at least 500 nm down into the substrate 4.

Whilst the embodiments illustrated in FIGS. 3 to 6 comprise an upper n-doped region 8 and a p-doped implant region 10 below to form pn-junction 6, other embodiments of this disclosure may have swapped the doping type, so that the upper doped region is p-doped and the implant region below is n-doped.

Figure 7:
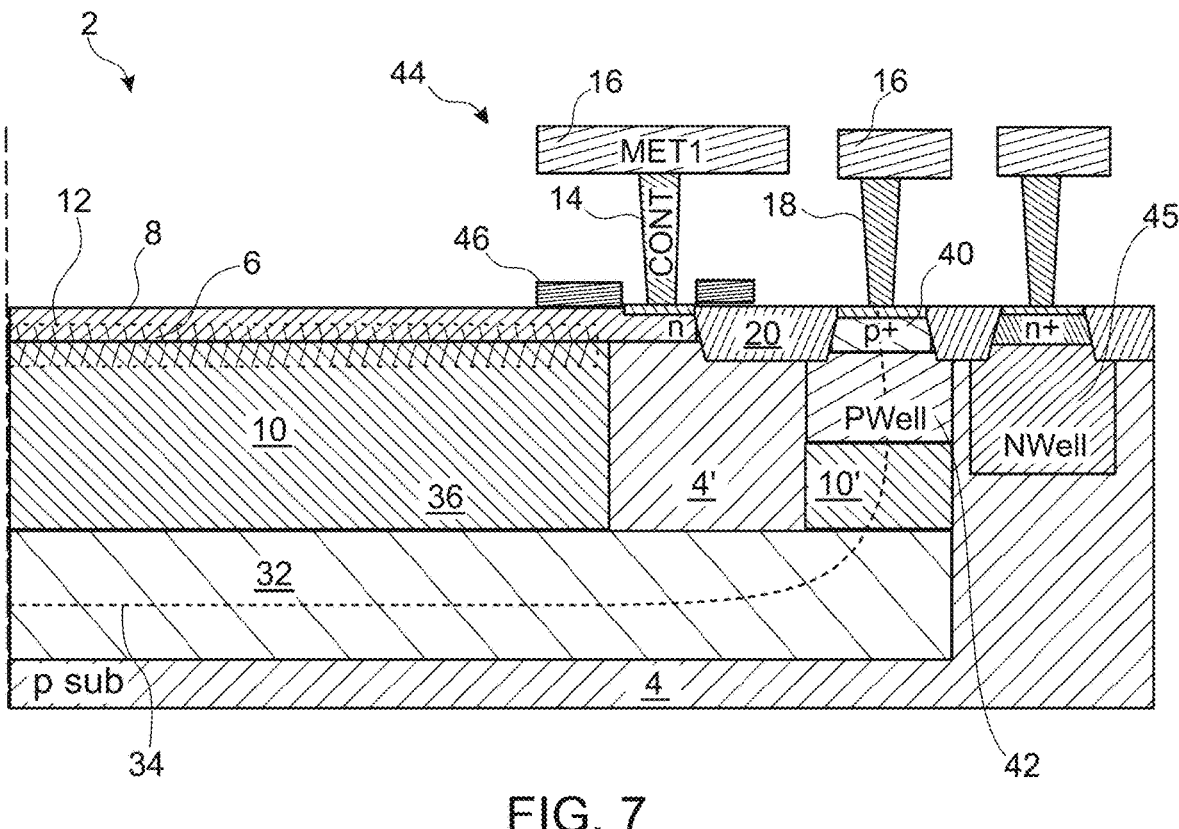
FIG. 7 shows a schematic diagram of a light sensitive semiconductor structure according to an embodiment comprising two p-doped implant regions, a low resistance contact region and an enclosed region.

In a particularly advantageous embodiment, the features of FIGS. 3, 5 and 6 are combined as illustrated in FIG. 7 described below.

FIG. 7 shows a schematic diagram of a cross section of a light sensor 2 being a SPAD according to an embodiment. The sensor 2 comprises a silicon substrate 4 with a pn-junction 6 between an n-doped region 8 and a p-doped region 10. The multiplication region 12 is located around the pn-junction 6. A second p-doped region 32 is provided underneath and in direct contact with the first p-doped region 10. The first and second p-doped regions 10 and 32 may also be referred to as implant regions, as they are formed by two (or more) implantations. In other embodiments, one or more further implant regions may be arranged between the first and second implant regions 10 and 32.

By having two p-doped regions 10 and 32 (two or more implantations), instead of just one (as e.g. in FIG. 1), the doping hump 30 can be moved away from the first p-doped region 10, as the peak concentration is pushed deeper into the light sensor 2. The dashed line 34 running through the second p-doped region 32 indicates the position of a peak in doping concentration, which defines a collection volume 36, from which charge carriers are "collected" (pushed towards the pn-junction 6 by the intrinsic electrostatic potential). Charge carriers generated outside the collection volume 36, will be blocked by the doping profile (unless the excess bias voltage is high enough to overcome the intrinsic electrostatic potential, as discussed later), which hence provides isolation.

The collection volume 36 is well defined, with only charge carriers generated inside the collection volume able to cause an event. The range of transit times for charge carriers to travel to the pn-junction is therefore also well defined. This can reduce the uncertainty of the arrival time and thereby provide more accurate readings, for example when the light sensor 2 is used in a time-of-flight (TOF) distance measuring device.

The collection volume can be significantly larger compared to conventional devices that only have one implant region. The increased collection volume 36 can provide a greater photodetection probability (PDP) and hence provide a larger output for a given light intensity. In particular, for light with longer wavelengths (e.g. IR) that penetrate deeper into the device, the light detector 2 can have greater PDP compared to conventional devices.

The n-doped region 8 is part of a cathode connected by a metal contact 14 to the first metal layer 16 (Metal 1) in the backend stack of the sensor 2. The first p-doped region 10 and the second p-doped region 32 are part of the anode connected by metal contact 18 to the first metal layer 16.

When in use, the bias voltage is applied between the cathode and the anode via contacts 14 and 18.

During implantation of the first p-doped region 10, a peripheral p-doped region 10' is also formed adjacent to and laterally spaced apart from the first p-doped region 10. An implantation mask can be used to provide the gap between the first p-doped region 10 and the peripheral p-doped region 10'.

The first and second p-doped regions 10 and 32, and the peripheral p-doped region 10' together enclose/define a region 4' of the substrate 4. The region 4' forms a ring in three dimensions around the first p-doped region 10 and above the second p-doped region 32. The enclosed region 4' can provide an additional benefit as it prevents the current from taking the shortest path directly underneath the STI 30 between the cathode and anode. Instead, due to the lower resistivity of the peripheral p-doped region 10' and of the second p-doped region 32, the current flows more homogenously to the multiplication region 12 and between contacts 14 and 18.

To further decrease the resistance between the metal contact 18 and the silicon, a heavily doped p+ region 40 is formed at the surface underneath the contact 18 and a p-well 42 is formed between the heavily p-doped region 40 and the peripheral p-doped region 10'. In use, current will follow the path of least resistance from the anode contact 18, through the heavily p-doped region 40, the p-well 42, the peripheral p-doped region 10', into the second p-doped region 32, up to the multiplication region 12, into the n-doped region 8, and to the cathode contact 14. The current flows around the enclosed region 4' of the substrate 4, which has a light doping and therefore higher resistivity.

Furthermore, due to the decreased resistivity of the p-doped regions 10, 10' and 32, compared to the surrounding substrate 4, a greater avalanche current can be achieved for a given bias voltage compared to conventional devices. A greater avalanche current in turn allows for quicker quenching as the device discharges following an event, which can increase the dynamic range (max intensity) of the light sensor 2. This can also simplify the quenching, as there is no need for transistor based quenching as the discharging of the excess biased SPAD can happen fast enough by the SPAD itself without any transistor support.

The light sensor 2 comprises an optional plasma shielding structure 44 for protecting the pn-junction 6 from plasma damage during manufacturing. The shielding structure 44 comprises polysilicon 46, and a part of the first metal layer 16, which overlap the edge of the pn-junction 6. By reducing plasma damage at or close to the pn-junction 6, the dark count rate (DCR) can be reduced. Also, the shallow trench isolation (STI) 20 is arranged such that the edge of the pn-junction 6 is buried underneath a part of the STI 30, which can provide further protection against plasma damage.

The sensor 2 further comprises an n-well guard ring 45. The guard ring may be beneficial to absorb charge carriers generated in the substrate 4, which would otherwise be trapped in the substrate 4. The guard ring 45 acts as a sink and prevents build-up of charge carriers in the substrate 4.

Figure 8:
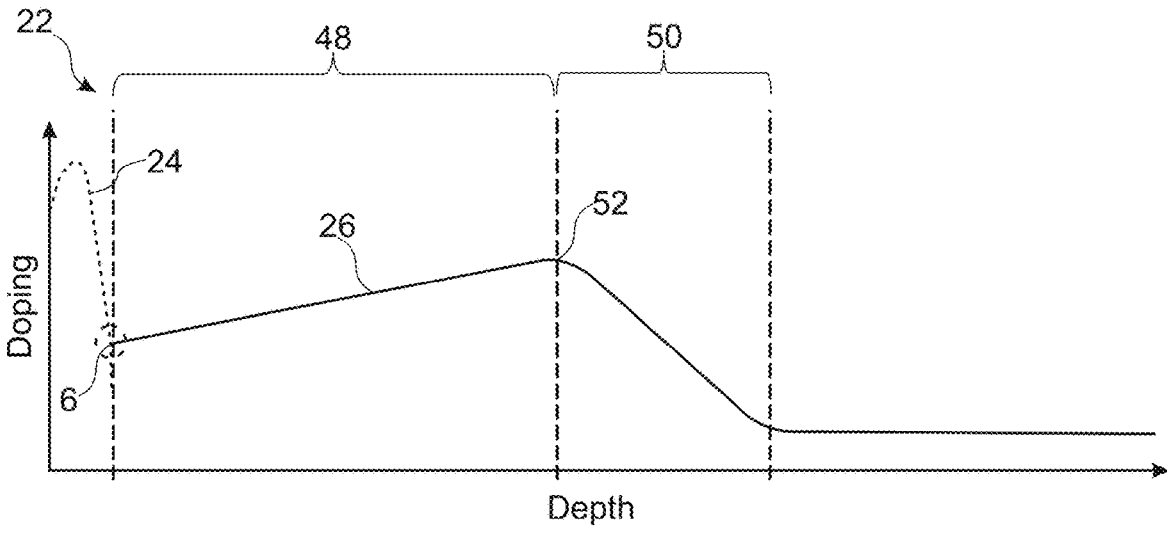
FIG. 8 shows a graph of the doping profile of the light sensitive semiconductor structure of FIG. 7.

FIG. 8 illustrates the doping profile 22 of the light sensor 2 in FIG. 7, which is substantially the same as the doping profile of the embodiment of FIG. 3 as illustrated in FIG. 4. Close to the surface, there is a high concentration of n-doping 24 which drops sharply towards the depth of the pn-junction 6. The doping at the pn-junction 6, can be adjusted to provide a target breakdown voltage. The p-typed doping 26 provides two regions 48 and 50 divided by the intrinsic electric field. In the first region 48, between the pn-junction 6 and the peak 52 in the doping profile 22, the doping concentration decreases substantially linearly towards the pn-junction 6. Importantly, there is no doping hump in this region 48, and all charge carriers in this region 48 will be pushed towards the multiplication region 12 around the pn-junction 6. Region 48 corresponds to the collection volume 36 as illustrated in FIG. 7. Charge carriers generated in the second region 50, on the other side of the peak 52 away from the pn-junction 6, are blocked by the intrinsic electric field (unless the excess bias voltage is sufficiently high to overcome the intrinsic field and push charge carriers over the peak 52 and into the other region 48).

In two specific embodiments of the light sensor 2, the peak 52 in the doping profile 22 is located at a depth of 3 μm and 4 μm respectively. A greater depth is associated with a larger collection volume 36 and increased PDP. The maximum achievable depth depends on the manufacturing process and the equipment used. With current manufacturing techniques it is difficult to achieve a depth greater than 5 μm. The implantation depth can be controlled by the implantation energy.

The light sensor 2 can be operated in two different modes depending on the level of applied bias voltage relative to the peak doping concentration in the second implant region 32. In the first (normal) mode, the doping profile 22 provides intrinsic isolation and the bias voltage is insufficient to push charge carriers over the peak 34 and into the collection volume 36. In the second mode, the bias voltage is greater such that charge carriers generated deeper in the substrate 4 (below the peak 34) will still tend to flow towards the pn-junction 6. In this second mode, there is no isolation and therefore no well-defined collection volume. Charge carriers generated anywhere in the substrate 4 can be detected, which increases the PDP of the device. However, the range of travel times of charge carriers is higher, which increases the uncertainty of time of flight measurements.

Figure 9:
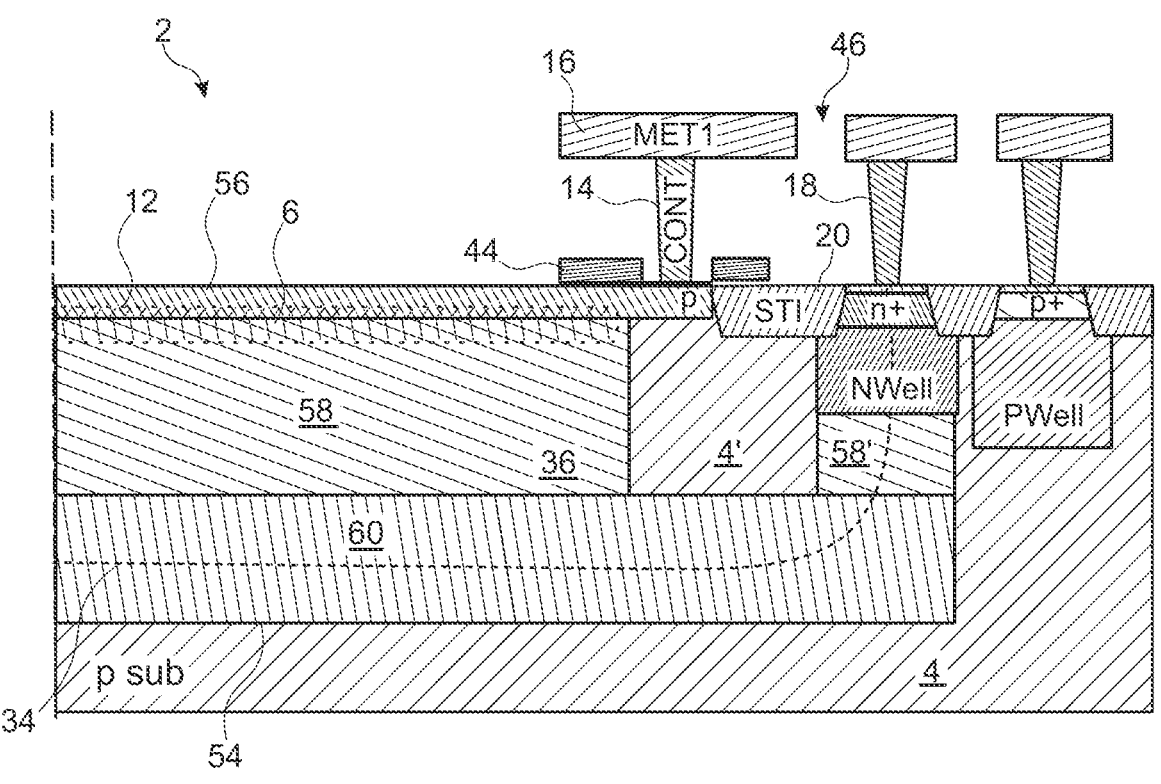
FIG. 9 shows a schematic diagram of a light sensitive semiconductor structure according to another embodiment comprising two n-doped implant regions.

FIG. 9 shows a different embodiment of a light sensor 2 having active isolation comprising a second pn-junction 54. The sensor 2 comprises a p-doped substrate 4, a first pn-junction 6 between a p-doped region 56 and a first n-doped region 58 below the p-doped region 56. A second n-doped region 60 is located below the first n-doped region 58. The first and second n-doped regions 58 and 60 (also referred to as implant regions) enclose/define the region 4' of the substrate 4. Hence, the light sensor 2 illustrated in FIG. 9 is similar to that of FIG. 7, but the type of doping of the implants has been swapped. This creates the second pn-junction 54 between the implanted n-regions 58 and 60 and the substrate 4. The p-doped region 56 at the surface forms part of a first anode, whilst the substrate 4 is part of a second anode. The n-doped regions 58 and 60 are part of a cathode. The second pn-junction 54 provides isolation by preventing charge carriers in the substrate 4 from reaching the multiplication region 12. No guard ring is necessary, since charge carriers in the substrate 4 will eventually reach the second pn-junction 54 and be collected there.

Figure 10:
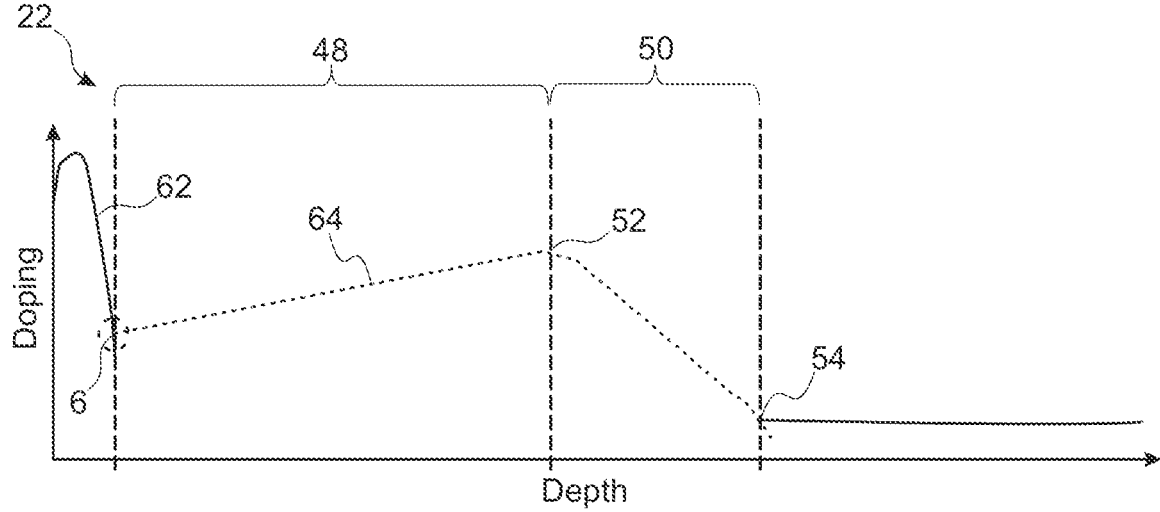
FIG. 10 shows a graph of the doping profile of the light sensitive semiconductor structure of FIG. 9.

FIG. 10 illustrates the doping profile 22 of the light sensor 2 in FIG. 9. The doping profile 22 is taken vertically through the structure along the central symmetry line. Close to the surface, there is a high concentration of p-doping 62 which drops sharply towards the depth of the pn-junction 6. The doping at the pn-junction 6, can be adjusted to provide a target breakdown voltage. The n-type doping 64 provides two regions 48 and 50 divided by the intrinsic electric field. In the first region 48, between the pn-junction 6 and the peak 52 in the doping profile 22, the doping concentration decreases substantially linearly towards the pn-junction 6. Importantly, there is no doping hump in this region 48, and all charge carriers in this region 48 will be pushed towards the multiplication region 12 around the pn-junction 6. Region 48 corresponds to the collection volume 36 as illustrated in FIG. 9. Charge carriers generated in the second region 50, on the other side of the peak 52 away from the pn-junction 6, are blocked by the intrinsic electric field (unless the excess bias voltage is sufficiently high to overcome the intrinsic field and push charge carriers over the peak 52 and into the other region 48). A second pn-junction 54 is located between the region 50 and the substrate 4. Charge carriers generated in the substrate 4 can be collected at this pn-junction 54.

It may be more difficult to implant an n-type dopant at greater depths, and therefore the peak doping 34 in the second implant region 60 may be located e.g. at a depth between 1 μm and 2.5 μm.

The lack of a doping hump can significantly improve the collection efficiency as more carriers reach the multiplication region. This can provide a SPAD with significantly higher red/Infra-red (IR) PDP compared to conventional SPADs.

Furthermore, embodiments described herein may be less dependent on the excess bias voltage. This allows a good PDP from very low values of bias voltage, which stays the same up to a certain limit. Beyond this limit the light sensor can still be used, but in a second operating mode, where the lack of isolation can increase PDP but also jitter due to the greater range of transit times for charge carriers to reach the multiplication region. When the isolation in the light sensor is not provided by a pn-junction, but by the doping profile, it is possible to operate it in these two modes. For lower excess bias voltages (e.g. <5 V) there is intrinsic isolation due to the doping profile. Beyond that, the electrical field is changed such that the device will show no isolation. Hence, at high excess bias voltages, the sensor can be operated to collect all carriers. The transition voltage (where the mode of the sensor changes) can be adjusted by the peak doping of the second (deeper) p-doped region.

In addition, the extended multiplication implant design can create an isolation, which can give the light sensor lower dark count rate (DCR) and better jitter (due to less volume from where free carriers can come). Also, the crosstalk between neighbouring SPADs can be dramatically reduced by the described embodiments.

FIGS. 11*a* to 11*d* illustrate a part of a method of forming a light sensitive semiconductor structure, such as the semiconductor structure of the sensor 2 illustrated in FIG. 7.

Figure 11A:
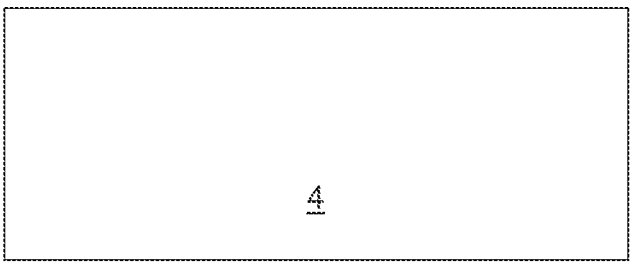
FIG. 11a shows a first step in a method according to an embodiment.

In FIG. 11*a*, a substrate 4 is provided, typically being a silicon substrate.

Figure 11B:
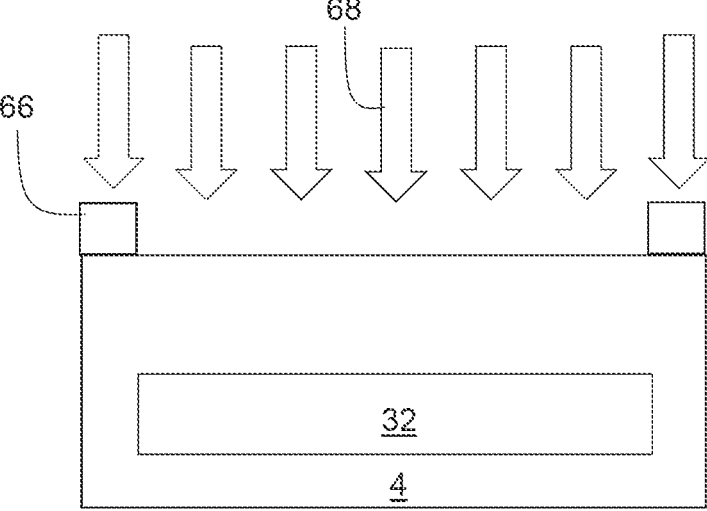
FIG. 11b shows a second step of the method comprising a first implantation.

In FIG. 11*b*, a mask 66 is applied to the substrate 4 and a first dopant 68 (e.g. boron) is implanted to form an implant region 32. During implantation, an ion beam illuminates the substrate and the mask. The implant depth can be adjusted by the implantation energy.

Figure 11C:
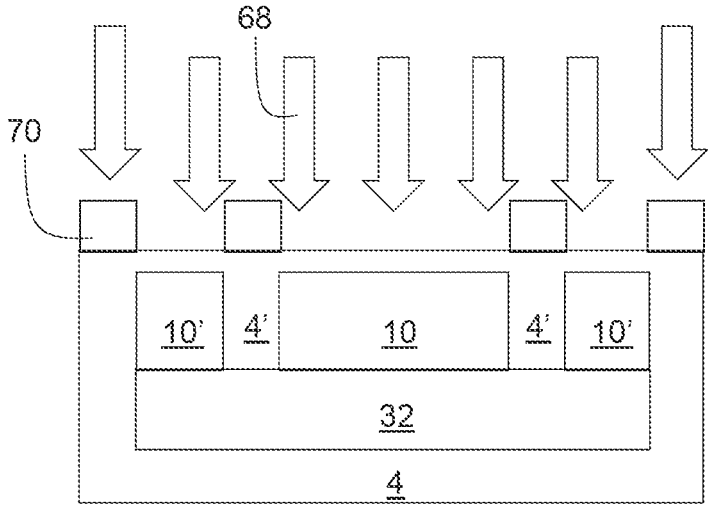
FIG. 11c shows a third step of the method comprising a second implantation.

In FIG. 11*c* a second mask 70 is applied to the substrate 4 and a second implantation is performed using the same type of dopant 68 to form another implant region 10 and a peripheral doped region 10'. The mask 70 is arranged to separate the first implant region 10 from the peripheral region 10' by a region 4' of the substrate 4.

Figure 11D:
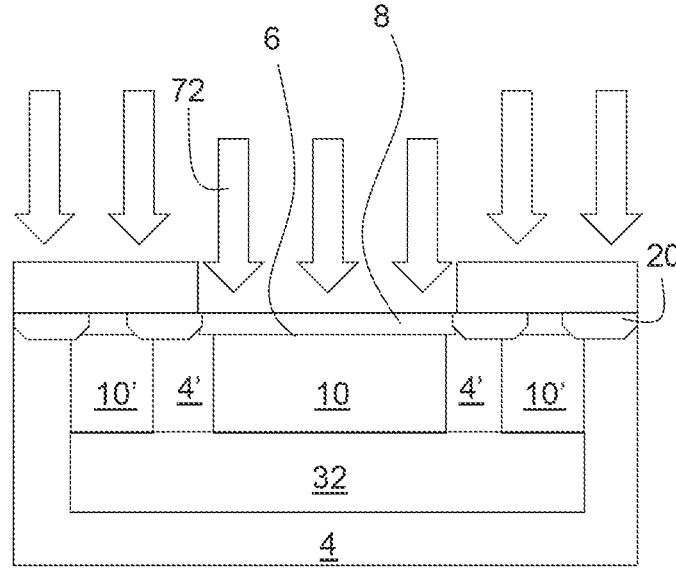
FIG. 11d shows a fourth step of the method.

In FIG. 11*d*, after providing STI 20, a third implantation is performed to form a doped surface region 8 over the first implant region 10. The third implantation uses a different dopant 72 (e.g. phosphorous) so as to provide a pn-junction 6 between the doped surface region 8 and the first implant region 10.

After forming the doped surface region, the method may comprise further steps such as providing contact structures in order to complete the device.

During device manufacturing of a light sensitive semi-conductor structure of for example a SPAD, to fit application demands the breakdown voltage should be adjusted and a proper avalanche region defined. The multiplication region is the region where impact ionization takes place. For that reason, a high dose and/or high energy implantation may be needed. For SPAD devices in particular, the perimeter of the optical active region is of high importance. Improper implantation in these areas can lead to a premature edge breakdown, which degrades the device performance.

The relatively high energy ion implantation requires a thick photoresist mask (e.g. having a thickness in the range of 2-10 μm. Unfortunately, for such a thick resist, the geometry at the edge of the resist opening changes during the ion implantation process and leads to skewed/sloped photoresist edge. A sloping edge in turn can lead to a smeared implantation profile under the resist edge, which can lead to premature edge breakdown in the final device.

Figure 12:
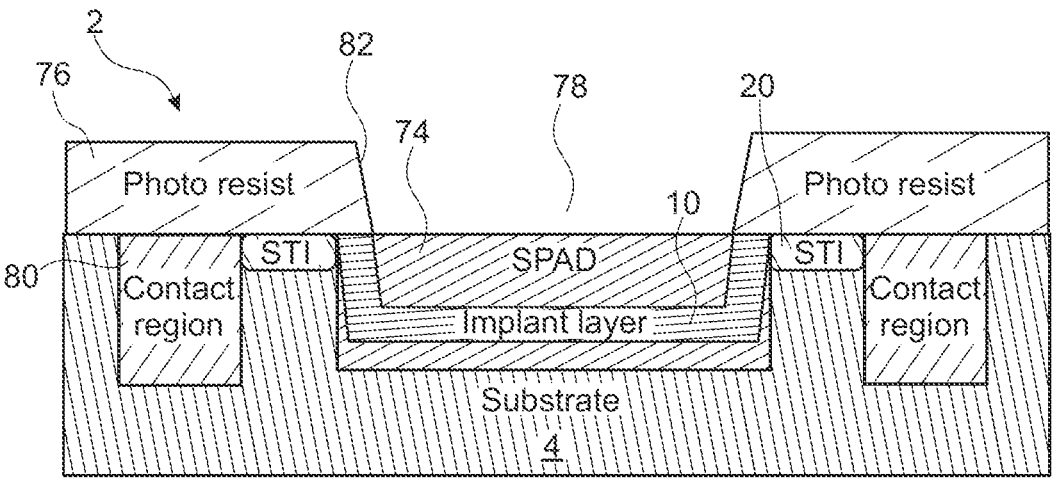
FIG. 12 shows a schematic diagram of a step of manufacturing a device.

FIG. 12 shows a schematic cross section of a light sensitive semiconductor structure 2 of a SPAD in a snapshot of manufacturing after implantation to form an implant region 10 in the optical active region 74 of the SPAD. A thick photoresist mask 76 with a central opening 78 over the optical active region 74 is used during the implantation to form the implant region 10. The photoresist mask 76 covers contact region 80 outside the optical active region 74.

The implantation (i.e. "baking" the resist and illuminating with ant ion beam) changes the shape of the photoresist mask 76, and in particular changes the angle of the edge 82. The baking step of the resist is done to outgas the resist, but causes the resist to shrink, which in turn causes the slope of the edge 82. Wider portions of resist have more pronounced slopes, as there is more tension due to the higher area to perimeter ratio. The mask will typically have a substantially perpendicular angle to the substrate 4 as it is provided on the substrate 4. After baking, the angle has decreased and the edge 82 declines towards the central opening 78.

The sloping edge 82 of the photoresist mask can affect the shape of the implant region 10, and in particular may increase the doping around the edges of optical active region, forming a U-shape as seen in FIG. 12.

To solve this problem the inventors have realised that the implant region can be improved by providing a gap in the photoresist mask outside of the optical active region. Accordingly, the implantation is done in the active area of the device and in a ring with a certain spacing outside the active area (corresponding to the gap in the photoresist). Ion implantation just outside the active area of the device is blocked by a narrow piece of photoresist, which better maintains its original geometry during the baking process compared to a conventional mask. The additional area that is implanted outside the optical active region has positive impact on the device performance, as it lowers the resistance along the current path.

The photoresist shape during ion implantation is kept by the layout of the device itself. The extra implant outside of the optical active region does not have an impact on the device performance. The approach can lead to significant improvements in the device performance of SPAD devices by avoiding premature edge breakdown, and may also be applied to other devices where the shape of the implant profile at the device edge plays an important role. Compared to known approaches for addressing the problem, the disclosed solution does not need additional deposition of sacrificial layers or other technical means that have to be introduced into the processing steps or equipment.

Figure 13:
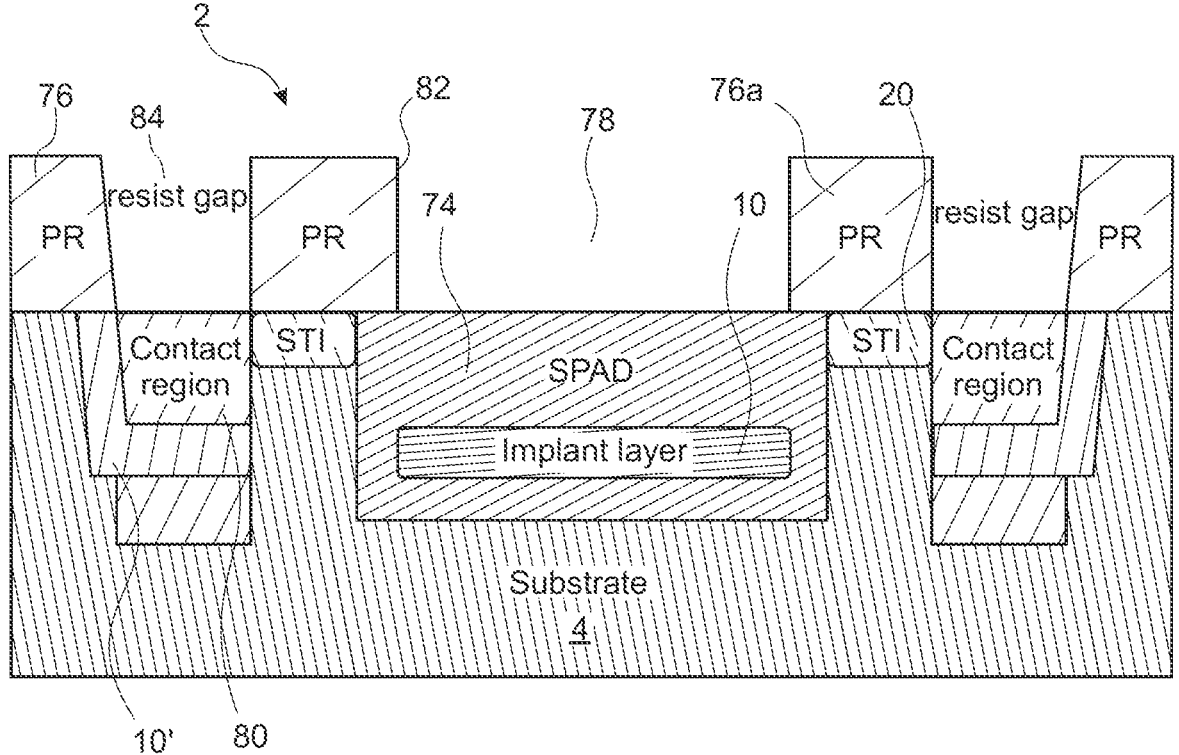
FIG. 13 shows a schematic diagram of a step of manufacturing a device using a photoresist mask with a gap.

FIG. 13 shows a schematic cross section of a light sensitive semiconductor structure 2 of a SPAD during manufacturing, wherein the described solution is applied to provide an improved implant region 10. In particular, the photoresist mask 76 has a gap 84 (forming a ring in three dimension) outside the optical active region 74 and over the contact region 80. Due to the gap 84, the inner part 76a of the photoresist mask 76 has substantially kept its shape after the implantation to form implant region 10. In particular, the inner edge 82 of the photoresist mask 76 is still substantially perpendicular to the underlying substrate 4, which in turn reduces implant smearing at the edge/perimeter of the optical active region 74 underneath the edge 82. In order to keep its geometry, the inner part 76a of the photoresist mask 76 may have a width in the range of 0.7-5 μm.

An additional implant region 10', which may be referred to as a peripheral implant region 10', is formed below the gap 84 in the contact region 80. The peripheral implant region 10' may not significantly influence device performance, but may advantageously be used to form structures such as described above. For example, the peripheral implant region 10', may be used to reduce the resistance in of the contact region 80 in order to support a larger avalanche current for a given bias voltage.

Figure 14A:
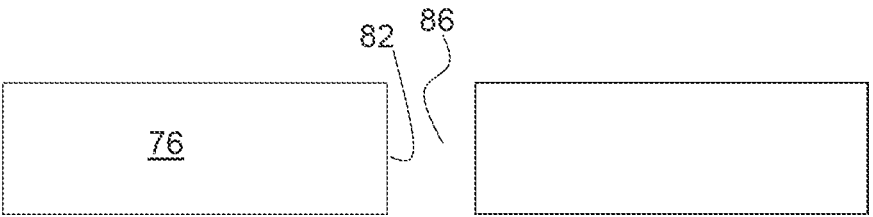
FIG. 14a shows a photoresist mask before implantation.
Figure 14B:
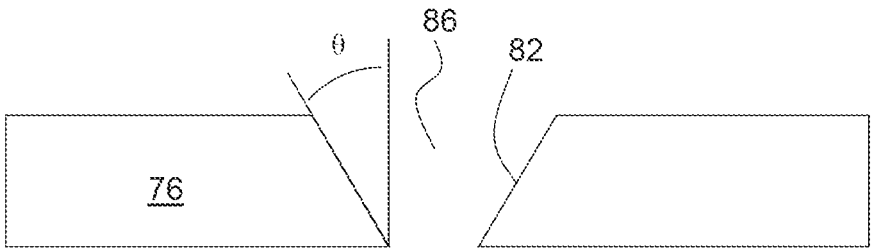
FIG. 14b shows the photoresist mask after implantation.

Experiments were conducted to determine how the layout of the photoresist mask affected the change of shape of the mask due to implantation. FIGS. 14a and 14b shows schematically the observed shape of a single opening 86 (i.e. no gap outside) in a photoresist mask 76 before and after resist bake respectively. The opening 86 forms a line through the photoresist in three dimensions. The opening 86 had an approximate width of 1 μm. The thickness of the photoresist was approximately 3 μm. After the baking step, as seen in FIG. 14b, the edge 82 of the opening 86 was declined/sloped at an angle θ of approximately 10° from the normal.

Figure 15A:
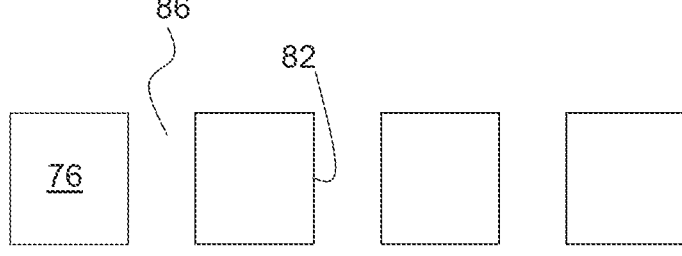
FIG. 15a shows another photoresist mask before implantation.
Figure 15B:
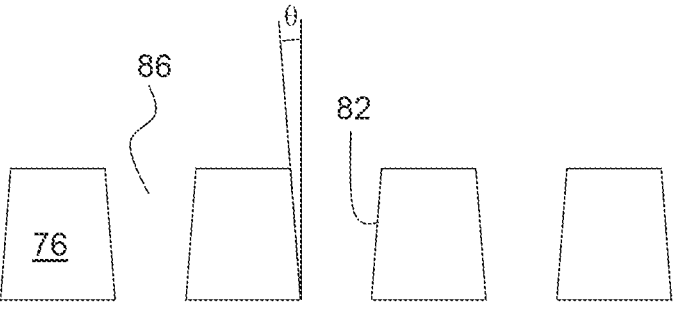
FIG. 15b shows the other photoresist mask after implantation.

FIGS. 15a and 15b show the results for a photoresist mask 76 having an array of 1 μm openings 86 (three shown). Implantation was performed using the same setup with the same implantation energy, dose etc. as for the mask with a single opening in FIG. 14a. After implantation, as shown in FIG. 15b, the edges 82 of the openings were declined at an angle θ of approximately 1° from the normal. Hence, it was shown that a relatively narrow part of photoresist, may be better at keeping its shape during bake before implantation.

In general, embodiments described herein provide a light sensitive semiconductor structure (e.g. a SPAD) comprising a substrate (typically silicon), a doped surface region at the surface of said substrate having a first type of doping (e.g. n-type), a first implant region located below and being in direct contact with said doped surface region, said first implant region having a second type of doping (e.g. p-type) so that a pn-junction is located between said doped surface region and said first implant region. The structure further comprises a second implant region located below said first implant region and having said second type of doping, wherein a peak in a doping profile of said second type of doping is located in said second implant region.

The multiplication implant (i.e. the first implant region) is not just used to increase the doping according to the level of the required breakdown voltage, as in a conventional device, but also extended to provide a collection volume from which the sensor gets its carriers. The second implant region may be located at a depth in the range of 1 μm to 5 μm. For example, when the second doping type is p-doping, the second implant region may preferably be located at a depth between 3 μm and 4 μm. When the second type of doping is n-doping, the second implant region may be located at a shallower depth between 1 μm and 2 μm.

The doping profile may comprise a continuously decreasing doping concentration from said peak to said pn-junction. For example, the doping profile may decrease substantially linearly towards said pn-junction in said first implant region, or all the way from said peak in doping concentration to said pn-junction. The collection volume is defined by the continuously decreasing doping profile towards the multiplication region and the pn-junction, surrounded by the peak in doping concentration. Carriers from outside this collection volume are rejected/blocked by the build-up in the doping profile, which creates an intrinsic electric field.

The structure preferably comprises a peripheral doped region having the same doping as said first implant region and being located at the same depth as said first implant region (because it is formed by the same implantation step). The peripheral doped region is located around said first implant region and is laterally separated from said first implant region by an enclosed region of said substrate. The second implant region extends laterally under said enclosed region of said substrate and at least partly under said peripheral doped region. The arrangement of the doped regions and the enclosed region of substrate provide a current path (a path with lower resistivity) around the enclosed region. This current path allows the current to flow more homogenously from the multiplication region of the device and can also support a higher avalanche current for a given bias voltage.

The structure may comprise first and second contacts for applying a bias voltage across said pn-junction of said semiconductor structure, wherein said peripheral doped region is arranged under said second contact so that current flowing to or from said second contact flows through said peripheral doped region. Hence, the first implant region, second implant region and peripheral doped region can be arranged such that current does not flow through said enclosed region of said substrate. This can prevent current from concentrating at the edge of the doped surface region, which is spatially closest to the other contact.

For example the first contact may be the cathode contact (the first type of doping of said doped surface region is n-doping), and said second contact is an anode contact (the second type of doping in the first and second implant regions is p-doping), and the light sensitive semiconductor structure can be arranged such that current flowing between the first and second contacts flows from said anode contact to said peripheral doped region, from said peripheral doped region to said second implant region, from said second implant region to said first implant region, from said first implant region to said doped surface region, and from said doped surface region to said cathode contact.

The light sensitive semiconductor structure may have said peak located at a depth in the range of 2 μm to 5 μm (under the surface of the substrate). A greater depth increases the collection volume and can also provide a deeper enclosed region of the substrate (between the first implant region and the doped peripheral region). The enclosed region should preferably have a depth of at least 500 nm. The peak may be located at a depth in the range of 3 μm to 4 μm, which provides good results.

Embodiments described herein also provide a method of forming a light sensitive semiconductor structure. The method comprises providing a substrate, providing a doped surface region at the surface of said substrate having a first type of doping, providing a first implant region located below and in direct contact with said doped surface region, said first implant region having a second type of doping so that a pn-junction is provided between said doped surface region and said first implant region. The method further comprises providing a second implant region located below said first implant region and having said second type of doping, and wherein a peak in a doping profile of said second type of doping is provided in said second implant region.

The step of providing said first implant region may comprise using a mask and implanting a first dopant in said substrate to form said first implant region and to form a peripheral doped region around said first implant region laterally separated from said first implant region by a region of said substrate. The mask shields the region of the substrate between the first implant region and the doped peripheral region. The step of providing said second implant region may then comprise using a different mask and implanting said first dopant in said substrate to form said second implant region.

Other embodiments provide a light sensitive semiconductor structure comprising a substrate, a doped upper region of said substrate having a first type of doping, an implant region located below and being in direct contact with said doped upper region, said implant region having a second type of doping so that a pn-junction is located between said doped upper region and said implant region, and a first and a second contact structure configured to apply a voltage across said pn-junction, wherein the first contact structure is directly connected to said upper doped region, and said second contact structure is directly connected to a low resistance region of said substrate. The low resistance region is in direct contact with the implant region, thereby providing a low resistance path between anode and cathode. The low resistance contact structure allows a larger avalanche current to flow between the contacts for a given bias voltage.

The low resistance region may comprise at least three vertically arranged doped regions. A first of said at least three vertically arranged doped regions may be a heavily doped region (e.g. p+) directly connected to said second contact structure, a second of said at least three vertically arranged doped regions may be the doped well region (e.g. PWell) in said substrate, and a third of said at least three vertically arranged doped regions may be another implant region.

The implant regions may have the same doping, and may be laterally separated and extend to a same depth in said substrate. Typically, the two implant regions are formed in a same implantation step.

Another embodiment provides a light sensitive semiconductor structure comprising a substrate, a first doped upper region of said substrate having a first type of doping, a second doped upper region laterally separated from said first doped upper region and having a second type of doping. An isolation structure (typically STI) is located between said first and second upper doped regions. The structure further comprises a low resistance path for current flow between said first and second doped upper regions arranged underneath said isolation structure and around an enclosed region of said substrate having a higher resistance. The enclosed region is typically a low doped region directly underneath the isolation structure. The enclosed region preferably extends to a depth of at least 500 nm below the surface.

The structure may further comprise an implant region located below and in direct contact with said first doped upper region, said implant region having said second type of doping so that a pn-junction is located between said doped upper region and said implant region. Said enclosed region may enclosed at least partially on one side by said implant region, and said low resistance path may go through said implant region.

Preferably, said implant region is a first implant region and the structure further comprises a second implant region having said second type of doping and being arranged below and in direct contact with said first implant region, wherein said enclosed region is enclosed on one side by said second implant region and wherein said low resistance path goes through said implant region. By having multiple implant regions, the doping hump may be moved away from the pn-junction.

Another embodiment provides a light sensitive semiconductor structure comprising a substrate, a pn-junction for collecting light generated charge carriers, and a collection volume enclosing said pn-junction and defined by a peak doping concentration in the substrate, such that an intrinsic electric field generated by a doping profile prevents charge carriers outside the collection volume from reaching said pn-junction. The doping profile may push charge carriers inside the collection volume towards the pn-junction. Typically, the doping profile slopes substantially linearly from the peak to the pn-junction. Charge carriers outside the collection volume need to overcome the intrinsic electric field to enter the collection volume. Hence, the doping profile provides passive isolation.

The structure may further comprise an upper doped region having a first type of doping, and one or more implant regions having a second type of doping, such that said pn-junction is located between said upper doped region and said one or more implant regions. Said peak doping concentration is located in at least one of said one or more implant regions.

A method of forming a light sensitive semiconductor structure comprises providing a substrate (typically a silicon substrate) and providing a photoresist mask on the substrate, wherein the photoresist mask comprises a central opening and a gap around the central opening. The method further comprises illuminating the substrate and photoresist mask with an ion beam (e.g. phosphorous or boron ions), thereby forming an implant region in an optical active region of said substrate below said central opening and forming a peripheral implant region in a contact region of said substrate below said gap in the photoresist mask. As part of the implantation, the photoresist mask will typically be baked before the illumination step.

The photoresist mask comprises a first edge towards said central opening, and said edge is typically substantially perpendicular to said substrate when providing said photoresist mask (i.e. before implantation). A perpendicular edge can provide a better implant region with less smearing around the edge of the optical active region. The width of the gap is not important, but may be for example in the range of 1 μm to 10 μm. The thickness of the photoresist mask may be in the range of 2-10 μm. The relatively thin part of the photoresist mask (between the central opening and the gap) may have a width in the range of 0.7-5 μm.

The method may further comprise forming an isolation structure, such as STI, in said substrate between said optical active region and said contact region.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein

The invention claimed is:

1. A light sensitive semiconductor structure comprising:
a substrate;
a doped upper region of said substrate having a first type of doping;
a first implant region located below and being in direct contact with said doped upper region, said first implant region having a second type of doping so that a pn junction is located between said doped upper region and said first implant region; and
a second implant region located below said first implant region and having said second type of doping, and wherein a peak in a doping profile of said second type of doping is located in said second implant region at a depth in the range of 2 μm to 5 μm, wherein said doping profile comprises a continuously decreasing doping concentration from said peak to said pn-junction.

2. A light sensitive semiconductor structure according to claim 1, wherein said doping profile decreases substantially linearly towards said pn-junction in said first implant region.

3. A light sensitive semiconductor structure according to claim 1, wherein said doping profile decreases substantially linearly from said peak to said pn-junction.

4. A light sensitive semiconductor structure according to claim 1, further comprising a peripheral doped region having the same doping as said first implant region and being located at the same depth as said first implant region, wherein said peripheral doped region is located around said first implant region and being laterally separated from said first implant region by an enclosed region of said substrate, and wherein said second implant region extends laterally under said enclosed region of said substrate and at least partly under said peripheral doped region.

5. A light sensitive semiconductor structure according to claim 1, further comprising first and second contacts for applying a bias voltage across said pn-junction of said semiconductor structure, wherein said peripheral doped region is arranged under said second contact so that current flowing to or from said second contact flows through said peripheral doped region.

6. A light sensitive semiconductor structure according to claim 5, wherein said first contact is a cathode contact and said first type of doping of said doped upper region is n-doping, and said second contact is an anode contact, and wherein the light sensitive semiconductor structure is arranged such that current flowing between the first and second contacts flows
from said anode contact to said peripheral doped region;
from said peripheral doped region to said second implant region;
from said second implant region to said first implant region;
from said first implant region to said doped upper region; and
from said doped upper region to said cathode contact.

7. A light sensitive semiconductor structure according to claim 4, wherein said first implant region, second implant region and peripheral doped region are arranged such that current does not flow through said enclosed region of said substrate.

8. A light sensitive semiconductor structure according to claim 1, wherein said peak is located at a depth in the range of 3 μm to 4 μm.

9. A light sensitive semiconductor structure according to claim 1, wherein said doped upper region is a doped surface region at the surface of said substrate.

10. A light sensitive semiconductor structure comprising:
a substrate;
a doped upper region of said substrate having a first type of doping;
a first implant region located below and being in direct contact with said doped upper region, said first implant region having a second type of doping so that a pn junction is located between said doped upper region and said first implant region;
a first and a second contact structure configured to apply a voltage across said pn-junction, wherein the first contact structure is directly connected to said upper doped region, and said second contact structure is directly connected to a low resistance region of said substrate, wherein said low resistance region is in direct contact with said first implant region and comprises at least three vertically arranged doped regions comprising:
a heavily doped region directly connected to said second contact structure,
a doped well region in said substrate, and
a second implant region laterally separated from said first implant region.

11. A light sensitive semiconductor structure according to claim 10, wherein said first and second implant regions have the same doping.

12. A light sensitive semiconductor structure according to claim 10, wherein said first and second implant regions extend to a same depth in said substrate.

13. A light sensitive semiconductor structure comprising:
a substrate;
a first doped upper region of said substrate having a first type of doping;
a second doped upper region laterally separated from said first doped upper region and having a second type of doping;

an isolation structure between said first and second upper doped regions;
a low resistance path for current flow between said first and second doped upper regions arranged underneath said isolation structure and around an enclosed region of said substrate having a higher resistance;
a first implant region located below and being in direct contact with said first doped upper region, said first implant region having said second type of doping so that a pn-junction is located between said doped upper region and said first implant region, wherein said enclosed region is enclosed at least partially on one side by said first implant region and wherein said low resistance path goes through said first implant region; and
a second implant region having said second type of doping and being arranged below and in direct contact with said first implant region, wherein said enclosed region is enclosed on one side by said second implant region and wherein said low resistance path goes through said second implant region.

14. A light sensitive semiconductor structure comprising:
a substrate;
a doped upper region of said substrate having a first type of doping;
a first implant region located below and being in direct contact with said doped upper region, said first implant region having a second type of doping;
a pn-junction located between said doped upper region and said first implant region for collecting light generated charge carriers;
a second implant region located below said first implant region and having said second type of doping, and wherein a peak in a doping profile of said second type of doping is located in said second implant region, wherein said peak doping concentration is located at a depth in the range of 2 μm to 5 μm;
a collection volume enclosing said pn-junction and defined by a peak doping concentration in the substrate, such that an intrinsic electric field generated by a doping profile prevents charge carriers outside the collection volume from reaching said pn-junction.

* * * * *